US009871980B2

(12) United States Patent
Pesach et al.

(10) Patent No.: US 9,871,980 B2
(45) Date of Patent: Jan. 16, 2018

(54) MULTI-ZONE IMAGING SENSOR AND LENS ARRAY

(71) Applicant: Apple, Inc., Cupertino, CA (US)

(72) Inventors: Benny Pesach, Rosh Ha'ayin (IL); Erez Sali, Savyon (IL); Alexander Shpunt, Tel Aviv (IL)

(73) Assignee: APPLE INC., Cupertino, CA (US)

( * ) Notice: Subject to any disclaimer, the term of this patent is extended or adjusted under 35 U.S.C. 154(b) by 336 days.

(21) Appl. No.: 14/687,927

(22) Filed: Apr. 16, 2015

(65) Prior Publication Data

US 2015/0222823 A1    Aug. 6, 2015

Related U.S. Application Data

(63) Continuation of application No. 13/437,977, filed on Apr. 3, 2012, now Pat. No. 9,030,528.

(60) Provisional application No. 61/471,215, filed on Apr. 4, 2011.

(51) Int. Cl.
*H04N 5/33* (2006.01)
*H04N 9/04* (2006.01)
*H01L 27/146* (2006.01)
*H04N 5/235* (2006.01)

(52) U.S. Cl.
CPC ....... *H04N 5/332* (2013.01); *H01L 27/14609* (2013.01); *H01L 27/14621* (2013.01); *H01L 27/14625* (2013.01); *H01L 27/14645* (2013.01); *H01L 27/14649* (2013.01); *H01L 27/14685* (2013.01); *H04N 5/2355* (2013.01); *H04N 9/045* (2013.01)

(58) Field of Classification Search
CPC ...... H04N 5/332; H04N 5/2355; H04N 9/045; H01L 27/14649; H01L 27/14645; H01L 27/14609; H01L 27/14621; H01L 27/14625; H01L 27/14685
See application file for complete search history.

(56) References Cited

U.S. PATENT DOCUMENTS

| | | |
|---|---|---|
| 6,503,195 B1 | 1/2003 | Keller et al. |
| 7,274,393 B2 | 9/2007 | Acharya |
| 2002/0154315 A1* | 10/2002 | Myrick .............. G02B 6/29349 356/450 |
| 2003/0038938 A1* | 2/2003 | Jung ........................ G01J 3/02 356/419 |
| 2005/0285966 A1 | 12/2005 | Bamji et al. |
| 2007/0201738 A1 | 8/2007 | Toda et al. |
| 2008/0122933 A1* | 5/2008 | Murayama ........ H01L 27/14837 348/164 |
| 2013/0092819 A1* | 4/2013 | Hall ................... G02B 27/1013 250/208.1 |

OTHER PUBLICATIONS

U.S. Appl. No. 14/149,859 Office Action dated Nov. 20, 2015.

\* cited by examiner

*Primary Examiner* — Sath V Perungavoor
*Assistant Examiner* — Howard D Brown, Jr.
(74) *Attorney, Agent, or Firm* — D. Kligler IP Services Ltd.

(57) ABSTRACT

An imaging module includes a matrix of detector elements formed on a single semiconductor substrate and configured to output electrical signals in response to optical radiation that is incident on the detector elements. A filter layer is disposed over the detector elements and includes multiple filter zones overlying different, respective, convex regions of the matrix and having different, respective passbands.

18 Claims, 3 Drawing Sheets

MULTI-ZONE IMAGING SENSOR AND LENS ARRAY

CROSS-REFERENCE TO RELATED APPLICATIONS

This application is a continuation of U.S. patent application Ser. No. 13/437,977, filed Apr. 3, 2012, which claims the benefit of U.S. Provisional Patent Application 61/471,215, filed Apr. 4, 2011, which is incorporated herein by reference.

FIELD OF THE INVENTION

The present invention relates generally to imaging systems, and particularly to devices and methods for multispectral imaging.

BACKGROUND

Many imaging applications involve capturing images simultaneously in multiple different spectral bands. For example, U.S. Patent Application Publication 2010/0007717, whose disclosure is incorporated herein by reference, describes an integrated processor for three-dimensional (3D) mapping. The device described includes a first input port for receiving color image data from a first image sensor and a second input port for receiving depth-related image data from a second image sensor. The second image sensor typically senses an image of a pattern of infrared radiation that is projected onto an object that is to be mapped. Processing circuitry generates a depth map using the depth-related image data and registers the depth map with the color image data. At least one output port conveys the depth map and the color image data to a host computer.

In some systems, a single image sensor is used to capture multiple images. For example, U.S. Pat. No. 7,231,069 describes a multiple-view-angle camera used in an automatic photographing apparatus, which includes a narrow view angle lens, a cylinder lens, and an image sensor. One image sensor is used, and a wide-view-angle image and a narrow-view-angle image are projected onto the image sensor at the same time.

As another example, U.S. Patent Application Publication 2004/0001145 describes a method and apparatus for multi-field image generation and processing, in which a camera includes a plurality of lenses configurable in a plurality of distinct directions. A plurality of image sensor areas collect charge fields of the scenes focused by the plurality of lenses. Processing logic coupled with the plurality of image sensor areas processes independent digital images for each of the plurality of image sensor areas.

SUMMARY

Embodiments of the present invention that are described hereinbelow provide integrated devices for use in multispectral imaging systems.

There is therefore provided, in accordance with an embodiment of the invention, an imaging module, which includes a matrix of detector elements formed on a single semiconductor substrate and configured to output electrical signals in response to optical radiation that is incident on the detector elements. A filter layer is disposed over the detector elements and includes multiple filter zones overlying different, respective, convex regions of the matrix and having different, respective passbands.

In disclosed embodiments, the respective passbands of the filter zones include an infrared passband and at least one visible passband. The at least one visible passband may include red, green and blue passbands. Typically, the filter zones and the respective convex regions are rectangular and share a common aspect ratio. In one embodiment, the filter zones include at least first and second zones of different, respective, first and second sizes that share the common aspect ratio.

In a disclosed embodiment, the imaging module includes a plurality of sense amplifiers, which are formed on the substrate and are coupled to read out photocharge from the detector elements in respective columns of the matrix, wherein sense amplifiers that are coupled to read out the photocharge from a first one of the convex regions have a different gain from the sense amplifiers that are coupled to read out the photocharge from at least a second one of the convex regions.

In some embodiments, the module includes objective optics, which are configured to form respective images of a common field of view on all of the regions of the matrix. The filter zones may include at least first and second zones of different, respective sizes, and the objective optics may include at least first and second lenses of different, respective magnifications, which are configured to form the respective images on the respective regions of the matrix that are overlaid by at least the first and second zones. In one embodiment, the objective optics include a transparent wafer, which is etched to define focusing elements for forming the respective images, and which is overlaid on the substrate.

There is also provided, in accordance with an embodiment of the invention, an imaging module, which includes a matrix of detector elements formed on a single semiconductor substrate and configured to output electrical signals in response to optical radiation that is incident on the detector elements. Objective optics are configured to focus light onto the matrix of the detector elements so as to form respective images of a common field of view on different, respective regions of the matrix. Multiple optical filters, which have different, respective passbands, are positioned so that each filter filters the light that is focused onto a different, respective one of the regions.

In one embodiment, the objective optics include multiple lenses, which are configured to form the respective images, and the filters are formed as coatings on the lenses. Additionally or alternatively, the filters include filter layers overlaid on the matrix of the detector elements. Further additionally or alternatively, the optical filters include an interference filter, which defines a narrow passband for the light incident on one of the regions of the matrix without affecting the respective passbands of the other regions.

In an alternative embodiment, the respective passbands of the filter zones comprise a luminance passband and chrominance passbands. Additionally or alternatively, the regions of the matrix comprise at least first and second regions of different, respective sensitivities, and the objective optics comprise at least first and second lenses of different, respective F-numbers, which are configured to form the respective images on at least the first and second regions.

In some embodiments, the imaging module includes a processor, which is configured to process the electrical signals output by the detector elements in the respective regions so as to generate, based on the respective images, multispectral image data with respect to an object in the images. In a disclosed embodiment, the respective passbands of the filter zones include an infrared passband for a first region of the matrix and at least one visible passband for at least a second region of the matrix, and the processor is configured to process the image data from the first region in order to generate a three-dimensional (3D) map of the field of view, and to register the 3D map with a two-dimensional (2D) image generated by at least the second region. Additionally or alternatively, the processor is configured to apply differential deblurring to the image data from different regions of the matrix.

There is additionally provided, in accordance with an embodiment of the invention, a method for imaging, which includes providing a matrix of detector elements formed on a single semiconductor substrate and configured to output electrical signals in response to optical radiation that is incident on the detector elements. A filter layer is overlaid on the detector elements, the filter layer including multiple filter zones overlying different, respective, convex regions of the matrix and having different, respective passbands.

There is further provided, in accordance with an embodiment of the invention, a method for imaging, which includes providing a matrix of detector elements formed on a single semiconductor substrate and configured to output electrical signals in response to optical radiation that is incident on the detector elements. Objective optics are aligned to focus light onto the matrix of the detector elements so as to form respective images of a common field of view on different, respective regions of the matrix. Multiple optical filters, which have different, respective passbands, are positioned so that each filter filters the light that is focused onto a different, respective one of the regions.

There is moreover provided, in accordance with an embodiment of the present invention, an imaging module, which includes a matrix of detector elements formed on a single semiconductor substrate and configured to output electrical signals having a first dynamic range in response to optical radiation that is incident on the detector elements. Objective optics are configured to focus light onto the matrix of the detector elements so as to form respective optical images of a common field of view on different, respective regions of the matrix so that the regions sense the optical images with different, respective levels of sensitivity. A processor is configured to process the electrical signals output by the detector elements in the respective regions so as to generate a combined electronic image of the common field of view with a second dynamic range that is greater than the first dynamic range.

In one embodiment, the objective optics include lenses having different, regions F-numbers for focusing the light onto the different, respective regions, wherein the F-numbers are chosen so as to provide the different, respective levels of sensitivity.

There is furthermore provided, in accordance with an embodiment of the present invention, a method for imaging, which includes providing a matrix of detector elements formed on a single semiconductor substrate and configured to output electrical signals having a first dynamic range in response to optical radiation that is incident on the detector elements. Objective optics are aligned to focus light onto the matrix of the detector elements so as to form respective images of a common field of view on different, respective regions of the matrix so that the regions sense the optical images with different, respective levels of sensitivity. The electrical signals output by the detector elements in the respective regions are processed so as to generate a combined electronic image of the common field of view with a second dynamic range that is greater than the first dynamic range.

The present invention will be more fully understood from the following detailed description of the embodiments thereof, taken together with the drawings in which:

DETAILED DESCRIPTION OF EMBODIMENTS

Figure 1:
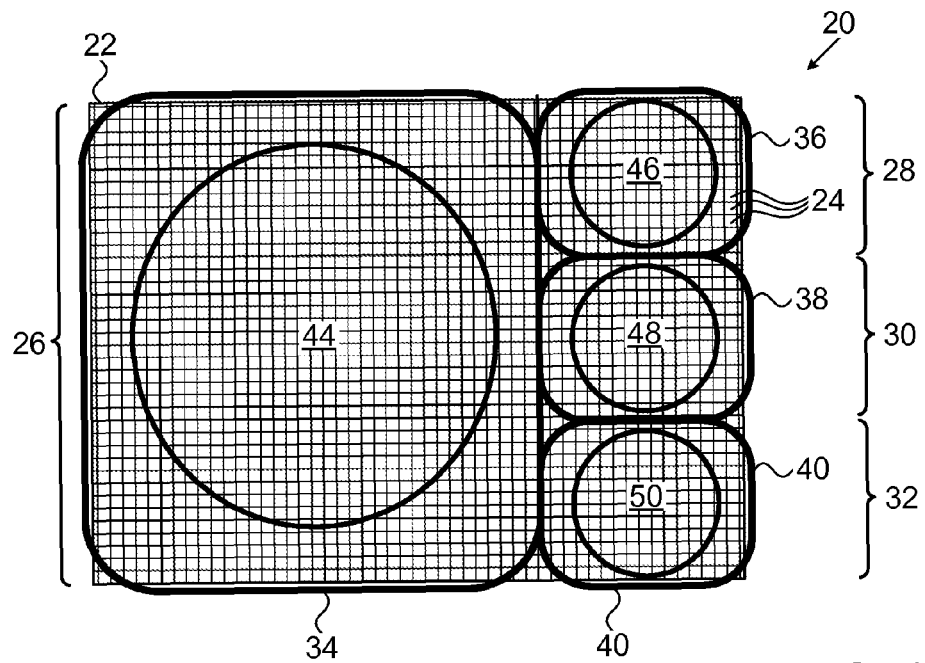
FIG. 1 is a schematic frontal view of an imaging module, in accordance with an embodiment of the present invention.

In the system described in U.S. Patent Application Publication 2010/0007717, separate color and infrared image sensors are used in generating a depth map that is registered with color image data. An embodiment of the present invention that is described hereinbelow enables both depth and color image data to be captured simultaneously by a single image sensor. More generally, embodiments of the present invention provide devices and methods that may be used to provide compact and inexpensive solutions for multispectral imaging.

In the disclosed embodiments, an imaging module comprises a matrix of detector elements, which are formed on a single semiconductor substrate and are configured to output electrical signals in response to optical radiation that is incident on the detector elements. Objective optics comprising multiple lenses focus light from a common field of view onto the matrix of the detector elements, and thus form multiple, respective images of this field of view side-by-side on different, corresponding regions of the matrix. A number of optical filters, with different, respective passbands, filter the light that is focused onto each region of the matrix.

Thus, two or more different images, each in a different spectral range, are formed simultaneously on different regions of the matrix. In the embodiments described below, the spectral ranges comprise infrared and visible light, specifically red, green and blue, but other spectral configurations may likewise be used and are considered to be within the scope of the present invention.

In some embodiments, a filter layer is disposed directly over the matrix of the detector elements. This filter layer comprises multiple filter zones overlying different, respective, convex regions of the matrix. Each filter zone has a different, respective passband, so that the corresponding region of the matrix captures an image in the spectral range defined by the passband. In the context of the present description and in the claims, the term "convex" is used in the accepted sense for describing regions in Euclidean vector space: A region is convex if for any pair of points within the region, every point on the straight line connecting the points is also in the region. In embodiments of the present invention, this criterion requires that the set of detector elements underlying each of the filter zones be convex in this sense and thus form a contiguous, closed region.

The regions of the matrix that capture the different images may be of different sizes, and the objective optics may then comprise lenses of different, respective magnifications for forming the respective images on the different regions. A processor may be coupled to process the electrical signals output by the detector elements in the respective regions so as to generate, based on the respective images, multispectral image data with respect to an object in the images. Because the images in the different spectral ranges are all formed on the same substrate, alignment and registration of the images can be easily achieved and maintained, notwithstanding the different image sizes.

Figure 2:
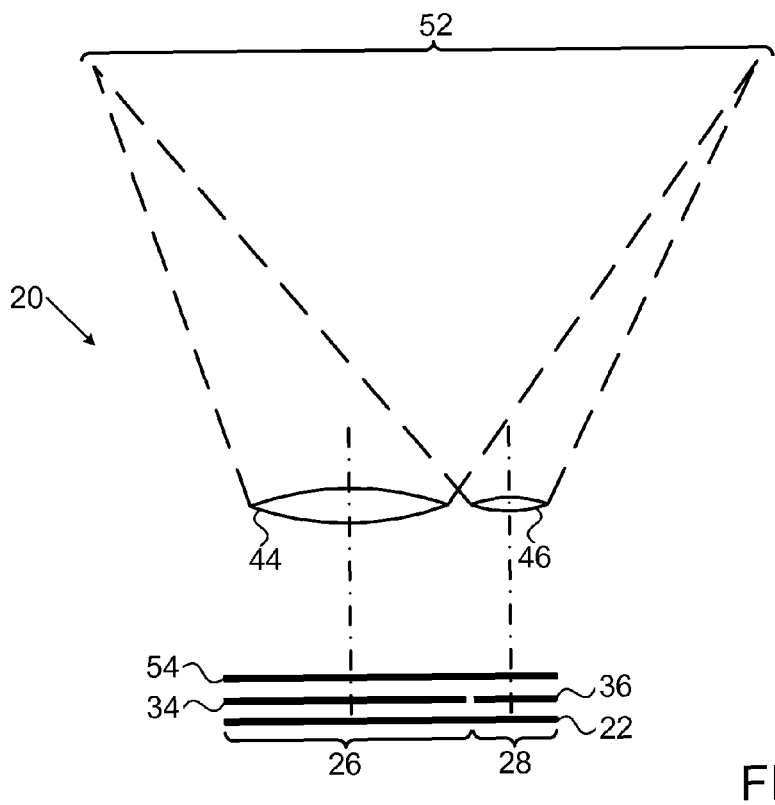
FIG. 2 is a schematic side view of the imaging module of FIG. 1.

Reference is now made to FIGS. 1 and 2, which schematically illustrate an imaging module 20, in accordance with an embodiment of the present invention. FIG. 1 is a frontal view, while FIG. 2 is a side view. Imaging module 20 comprises a single semiconductor substrate 22, such as a silicon wafer substrate, on which a matrix of detector elements 24 is formed. The detector elements and associated control and readout circuitry (not shown) may be produced using any suitable process known in the art. For example, substrate 22 and detector elements 24 may be configured as a CCD or CMOS-type image sensor. In one embodiment, module 20 is based on a commercially-available CMOS image sensor with full-HD (1920×1080) resolution, such as the OV2710 image sensor available from OmniVision (Santa Clara, Calif.).

The matrix of detector elements 24 is overlaid by a filter layer, which comprises filter zones 34, 36, 38, 40, overlying respective regions 26, 28, 30, 32 of the matrix. Each filter zone has a different passband; for example, zone 34 may pass infrared light, while zones 36, 38 and 40 pass red, green and blue light, respectively. Objective optics, comprising lenses 44, 46, 48 and 50, focus light respectively through filter zones 34, 36, 38, 40 onto regions 26, 28, 30, 32, and thus form an image on each of the regions of a common field of view 52, with each such image representing a different spectral range. In this manner, module 20 may simultaneously form infrared and color images, all of the same field of view 52. Alternatively, in other embodiments (not shown in the figures), a similar effect may be obtained by forming the filters as coatings on the corresponding lenses, or by positioning the filters at any other suitable location in the optical path.

Imaging module 20 may advantageously be used for 3D mapping and color imaging, as described in the above-mentioned U.S. Patent Application Publication 2010/0007717, for example. As noted above, module 20 has the advantage of providing both IR and color images within a single unit in fixed registration, in contrast to systems known in the art, in which active alignment and registration may be required. A pattern of IR radiation is projected onto a scene of interest, and the IR image is processed in reconstruct a 3D map of the scene.

In pattern-based 3D mapping systems, it is generally desirable to filter incoming IR radiation with a narrowband filter, which is matched to the wavelength of the pattern projector. Filter zones 34, 36, 38, 40 that are produced by coating a filter layer over the image sensor, however, typically have broad passbands. Therefore, in the embodiment that is illustrated in FIG. 1, an additional narrowband IR filter 54 is interposed in the light path. Typically, filter 54 is an interference filter, comprising thin film layers on a transparent substrate (such as glass), designed to be transparent to visible radiation while blocking IR radiation outside a narrow band containing the projection wavelength. Thus, filter 54 narrows the IR passband of module 20 without affecting the visible passbands.

The filter zones and corresponding regions of the matrix of detector elements in the present example are rectangular and may be of different sizes, as shown in FIGS. 1 and 2. In this case, the lenses will typically have different magnifications. Specifically, in the pictured example, lens 44 has a greater magnification than lenses 46, 48 and 50 and thus forms a larger image on the correspondingly larger region 26. The lenses are aligned to ensure that all will simultaneously form focused images of field of view 52 on the respective regions 26, 28, 30, 32. This alignment is typically adjusted and tested at the time of manufacture, but it may be adjusted subsequently in the field. Alternatively or additionally, other optical elements, such as mirrors and/or prisms (not shown in the figures), may be used in directing the respective images onto the different regions of the matrix of detector elements.

Despite the different sizes of regions 26, 28, 30, 32, the regions may share a common aspect ratio, meaning that the ratio of height to width is similar among the different regions. For example, using a full-HD image sensor as described above, region 26 could comprise 1280×1080 detector elements, while regions 28, 30 and 32 each comprise 640×360 detector elements. (Although the aspect ratios are not precisely the same, their similarity means that images from all the regions may be registered with relatively minor cropping of the image from region 26.) The common aspect ratio of the regions is useful when the different images are to be registered with one another. This configuration may be used, for example, to provide a high-resolution IR image (such as for 3D mapping) and a lower-resolution RGB color image, all with a 16×9 HD image format.

Other configurations of the regions and corresponding filter zones are also possible. For example, an image sensor and filters may be configured to include a larger, high-resolution luminance imaging zone (which receives the full spectrum of visible light) and smaller color-sensitive zones. This sort of sensor may be used to create color images in accordance luminance/chrominance standards, such as YUV.

Figure 3:
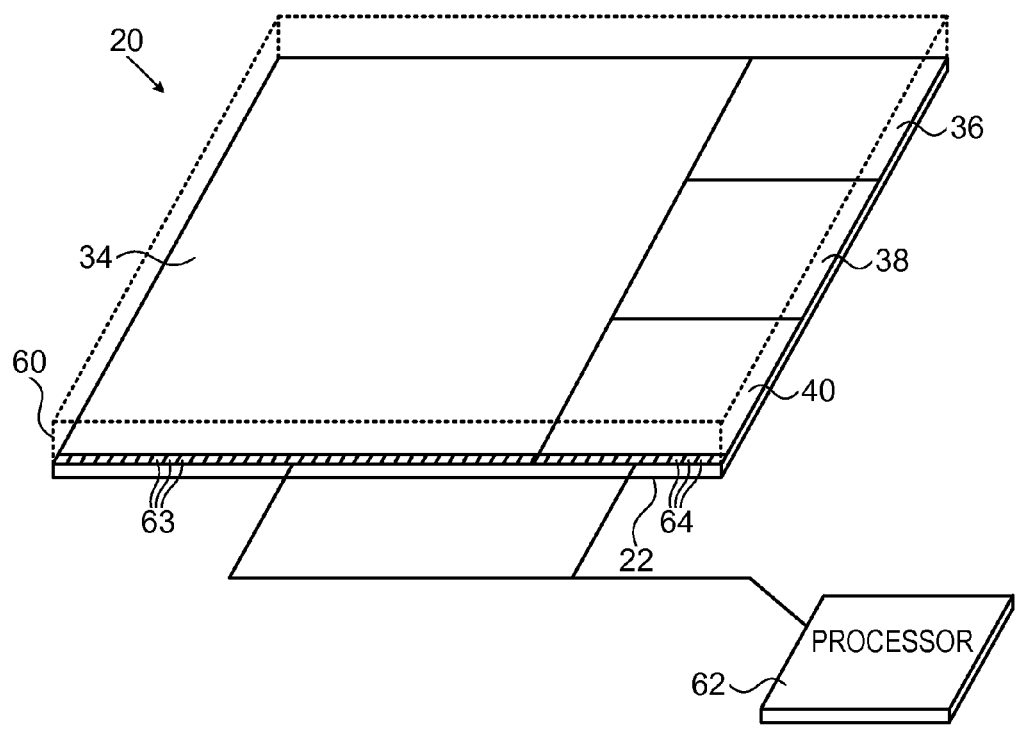
FIG. 3 is a schematic, pictorial view of an integrated imaging module, in accordance with an embodiment of the present invention.

FIG. 3 is a schematic, pictorial view of imaging module 20, in accordance with an integrated embodiment of the present invention. In this embodiment, the objective optics comprise a transparent wafer 60, which is etched to define focusing elements corresponding to lenses 44, 46, 48 and 50 for forming the respective images on the different regions of the matrix of detector elements 24 on substrate 22. Techniques for this sort of wafer-scale optical production are known in the art. One or more optical wafers of this sort (of which only one wafer is shown in the figure) may be fabricated and overlaid on substrate 22 in order to achieve the desired focusing characteristics.

The photocharge accumulated by detector elements 24 is read out through column sense amplifiers 63, 64. In the pictured embodiment, amplifiers 63 read out the columns of region 26 (overlaid by filter zone 34), while amplifiers 64 read out the columns of regions 28, 30, 32 (overlaid respectively by filter zones 36, 38, 40). Thus, the IR image signals are read out via amplifiers 63, while the RGB image signals are read out by amplifiers 64. This arrangement is advantageous, since it allows a different gain setting to be applied to the IR signal from that applied to the RGB signals. In the 3D mapping applications described above, for example, the IR image is typically faint, and amplifiers 63 may therefore be set to a higher gain than amplifiers 64. In other applications, in which region 26 receives ambient IR radiation, amplifiers 63 may be set to a lower gain.

The arrangement of amplifiers 63, 64 along the edge of the image sensor is also advantageous in that it does not depart from the layout of image sensor chips that are known in the art (other than having different, possibly adjustable gain controls for the different amplifiers). Alternatively, further sense amplifiers and readout lines may be provided on substrate 22 to enable independent gain settings for zones 28, 30 and 32, as well.

Additionally or alternatively, the relative F-numbers of lenses 44, 46, 48 and 50 may be chosen so that the amount of light focused onto each of regions 26, 28, 30, 32 is adjusted to compensate for the different sensitivities of the regions. In other words, more light may be focused onto the less sensitive regions, and less light onto the more sensitive regions, thus enhancing the overall dynamic range of the imaging module.

As yet another alternative imaging module 20 may be used to implement high dynamic range imaging, by dividing the image sensor into more sensitive and less sensitive regions. The variation in the respective levels of sensitivity may be achieved by appropriate choice of the corresponding lens F-numbers. The more sensitive region will capture details in the low-light parts of the image, while the less sensitive region will simultaneously capture high-light parts. A processor combines the simultaneously-acquired image information from both regions to create a single image with a dynamic range that is higher than the dynamic range of the electrical signals that are output by the detector elements of the image sensor.

A processor 62 receives the electrical signals that are output by detector elements 24 on substrate 22. Although FIG. 3, for the sake of conceptual clarity, shows separate connections between processor 62 and the different regions of the image sensor, in practice the signals from all of the detector elements in the different regions may be read out through common output circuits to the processor, which then uses timing information to separate out the corresponding images. Furthermore, although the processor is shown in the figure as a separate unit from the image sensor, the processor may alternatively be formed on substrate 22 alongside the matrix of detector elements.

Processor 62 typically registers the images formed on regions 26, 28, 30 and 32 to generate multispectral image data with respect to objects in field of view 52. For example, processor 62 may use an infrared image, captured in region 26, of a pattern that is projected onto objects in the field of view in order to produce a 3D map of the objects, and may integrate the 3D map with a color image of the objects captured by regions 28, 30 and 32. Suitable circuits and techniques for this purpose are described in the above-mentioned U.S. Patent Application Publication 2010/0007717. Alternatively or additionally, processor 62 may carry out other sorts of image processing operations, as are known in the art.

As noted earlier, lenses 44, 46, 48 and 50 are designed to have the same back focal length, but it may happen due to production tolerances that after module 20 is assembled, some of these lenses will be better focused than others. The defocus may be measured, for example, by capturing an image of a suitable resolution target. Processor 62 may then be programmed to compensate for the focal quality differences by applying a deblurring algorithm to the images, with differential deblurring for the different regions. Algorithms that are known in the art may be used, mutatis mutandis, for this purpose. For example, in one embodiment, processor 62 applies the Lurry-Richardson algorithm, as described by Richardson in an article entitled "Bayesian-Based Iterative Method of Image Restoration," *Journal of the Optical Society of America* 62:1, pages 55-59 (1972), which is incorporated herein by reference.

Figure 4:
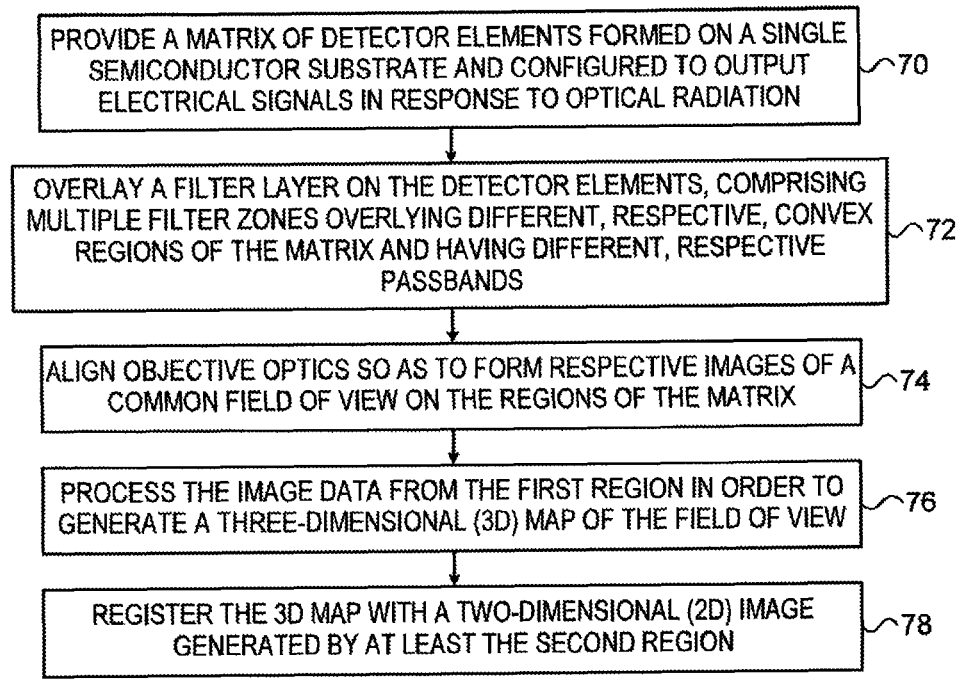
FIGS. 4 and 5 are flow charts that schematically illustrate methods for imaging, in accordance with embodiments of the present invention.

FIG. 4 is a flow chart that schematically illustrates a method for imaging, in accordance with an embodiment of the present invention. At step 70, a matrix of detector elements is formed on a single semiconductor substrate and configured to output electrical signals in response to optical radiation that is incident on the detector elements. At step 72, a filter layer is overlaid on the detector elements, comprising multiple filter zones overlying different, respective, convex regions of the matrix and having different, respective passbands. The filter zones define filters, such that each filter filters the light that is focused onto a different, respective one of the regions. At step 74, objective optics are aligned to focus light onto the matrix of the detector elements so as to form respective images of a common field of view on different, respective regions of the matrix. Optionally, at step 76, image data from a first region are processed in order to generate a 3D map of the field of view. At step 78, the 3D map is registered with a 2D image generated by at least a second region.

Figure 5:
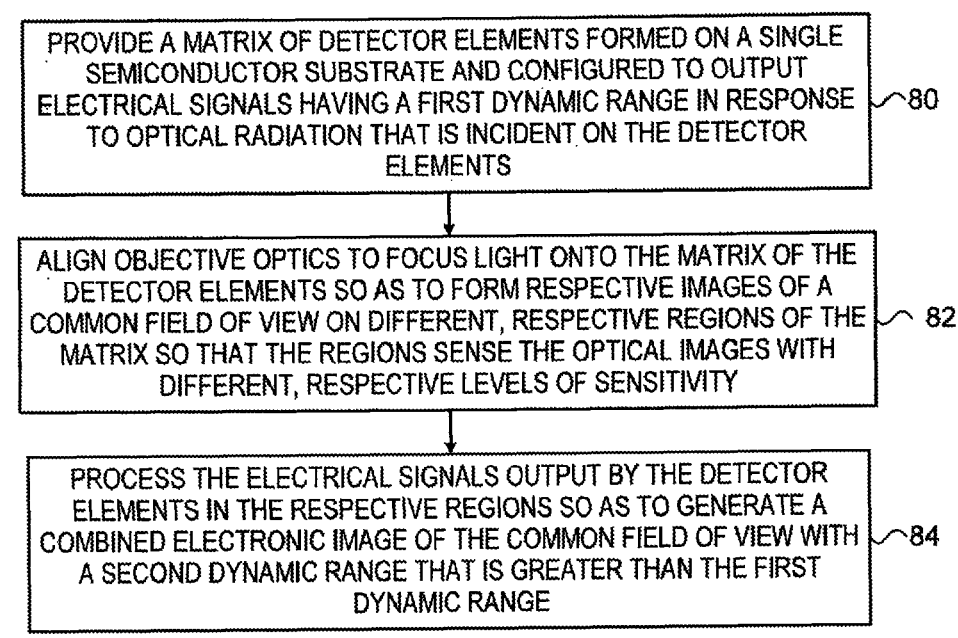

FIG. 5 is a flow chart that schematically illustrates a method for imaging, in accordance with another embodiment of the present invention. At step 80, a matrix of detector elements is formed on a single semiconductor substrate and configured to output electrical signals having a first dynamic range in response to optical radiation that is incident on the detector elements. At step 82, objective optics are aligned to focus light onto the matrix of the detector elements so as to form respective images of a common field of view on different, respective regions of the matrix so that the regions sense the optical images with different, respective levels of sensitivity. At step 84, the electrical signals output by the detector elements in the respective regions are processed so as to generate a combined electronic image of the common field of view with a second dynamic range that is greater than the first dynamic range.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:
1. An imaging module, comprising:
a matrix of detector elements formed on a single semiconductor substrate and configured to output electrical signals in response to optical radiation that is incident on the detector elements;
a filter layer, which is disposed over the detector elements and comprises multiple filter zones overlying different, respective, convex regions of the matrix and having different, respective passbands, including a first filter zone overlying a first region of the matrix and having an infrared passband and a second filter zone having at least one visible passband overlying a second region of the matrix;
objective optics, which are configured to form respective images of a common field of view on all of the regions of the matrix; and
a processor, which is configured to process the electrical signals output by the detector elements in the first region so as to produce a three-dimensional (3D) map of the field of view, and to register the 3D map with a two-dimensional (2D) image of the field of view that is generated by the detector elements in the second region.

2. The imaging module according to claim 1, wherein the at least one visible passband comprises red, green and blue passbands.

3. The imaging module according to claim 1, wherein the filter zones and the respective convex regions are rectangular and share a common aspect ratio.

4. The imaging module according to claim 1, wherein the imaging module comprises a plurality of sense amplifiers, which are formed on the substrate and are coupled to read out photocharge from the detector elements in respective columns of the matrix,
wherein the sense amplifiers that are coupled to read out the photocharge from a first one of the convex regions have a different gain from the sense amplifiers that are coupled to read out the photocharge from at least a second one of the convex regions.

5. The imaging module according to claim 1, wherein the filter zones comprise at least first and second zones of different, respective sizes, and wherein the objective optics comprise at least first and second lenses of different, respective magnifications, which are configured to form the respective images on the respective regions of the matrix that are overlaid by at least the first and second zones.

6. The imaging module according to claim 1, wherein the objective optics comprise a transparent wafer, which is etched to define focusing elements for forming the respective images, and which is overlaid on the substrate.

7. An imaging module, comprising:
a matrix of detector elements formed on a single semiconductor substrate and configured to output electrical signals in response to optical radiation that is incident on the detector elements;
objective optics, which are configured to focus light onto the matrix of the detector elements so as to form respective images of a common field of view on different, respective regions of the matrix;
multiple optical filters, which have different, respective passbands, including a first optical filter having an infrared passband and at least one second optical filter having a visible passband, and are positioned so that each filter filters the light that is focused onto a different, respective one of the regions, including a first region onto which the light filtered by the first optical filter is focused and a second region onto which the light filtered by the at least one second optical filter is focused; and
a processor, which is configured to process the electrical signals output by the detector elements in the first region so as to produce a three-dimensional (3D) map of the field of view, and to register the 3D map with a two-dimensional (2D) image of the field of view that is generated by the detector elements in the second region.

8. The imaging module according to claim 7, wherein the objective optics comprise multiple lenses, which are configured to form the respective images, and wherein the filters are formed as coatings on the lenses.

9. The imaging module according to claim 7, wherein the filters comprise filter layers overlaid on the matrix of the detector elements.

10. The imaging module according to claim 9, wherein the optical filters further comprise an interference filter, which defines a narrow passband for the light incident on one of the regions of the matrix without affecting the respective passbands of the other regions.

11. The imaging module according to claim 7, wherein the at least one visible passband comprises red, green and blue passbands.

12. The imaging module according to claim 7, wherein the respective passbands of the filter zones comprise a luminance passband and chrominance passbands.

13. The imaging module according to claim 7, wherein the regions of the matrix comprise at least first and second regions of different, respective sensitivities, and wherein the objective optics comprise at least first and second lenses of different, respective F-numbers, which are configured to form the respective images on at least the first and second regions.

14. The imaging module according to claim 7, wherein the objective optics comprise a transparent wafer, which is etched to define a plurality of lenses, and which is overlaid on the substrate.

15. A method for imaging, comprising:
providing a matrix of detector elements formed on a single semiconductor substrate and configured to output electrical signals in response to optical radiation that is incident on the detector elements;
overlaying a filter layer on the detector elements, the filter layer comprising multiple filter zones overlying different, respective, convex regions of the matrix and having different, respective passbands, including a first filter zone having an infrared passband overlying a first region of the matrix and a second filter zone having at least one visible passband overlying a second region of the matrix;
aligning objective optics so as to form respective images of a common field of view on all of the regions of the matrix; and
processing the image data from the first region in order to produce a three-dimensional (3D) map of the field of view, and registering the 3D map with a two-dimensional (2D) image generated by the second region.

16. The method according to claim 15, wherein the first and second regions of the matrix have different, respective sizes, and wherein aligning the objective optics comprise providing at least first and second lenses of different, respective magnifications so as to form the respective images on at least the first and second regions.

17. The method according to claim 15, wherein the at least one visible passband comprises red, green and blue passbands.

18. The method according to claim 15, wherein the filter zones and the respective convex regions are rectangular and share a common aspect ratio.

* * * * *